United States Patent
Oh

(10) Patent No.: US 7,224,626 B2
(45) Date of Patent: May 29, 2007

(54) REDUNDANCY CIRCUITS FOR SEMICONDUCTOR MEMORY

(75) Inventor: Jong-Hoon Oh, Chapel Hill, NC (US)

(73) Assignee: Infineon Technologies AG, Munich (DE)

(*) Notice: Subject to any disclaimer, the term of this patent is extended or adjusted under 35 U.S.C. 154(b) by 66 days.

(21) Appl. No.: 11/108,179

(22) Filed: Apr. 18, 2005

(65) Prior Publication Data

US 2006/0233014 A1   Oct. 19, 2006

(51) Int. Cl.
*G11C 7/00*   (2006.01)
(52) U.S. Cl. ........................................ 365/200
(58) Field of Classification Search ................ 365/200, 365/70, 201, 149
See application file for complete search history.

(56) References Cited

U.S. PATENT DOCUMENTS

| | | | | |
|---|---|---|---|---|
| 5,022,006 A | * | 6/1991 | Fifield et al. | ............... 365/200 |
| 5,495,445 A | * | 2/1996 | Proebsting | ................... 365/200 |
| 5,945,702 A | * | 8/1999 | Nakanishi | ................... 257/296 |
| 6,292,383 B1 | * | 9/2001 | Worley | ....................... 365/69 |
| 6,304,499 B1 | | 10/2001 | Pöchmüller | |
| 6,426,269 B1 | | 7/2002 | Haffner et al. | |
| 6,865,124 B2 | | 3/2005 | Takase | |
| 2003/0043645 A1 | * | 3/2003 | Pinney | ....................... 365/190 |

\* cited by examiner

*Primary Examiner*—Son Dinh
(74) *Attorney, Agent, or Firm*—Dicke, Billig & Czaja, PLLC

(57) ABSTRACT

A semiconductor random access memory device has an array of normal memory and an array of dummy memory cells. The array of the dummy memory cells are controlled in order to form a redundant twin-cell structure that includes at least one of the dummy memory cells.

22 Claims, 3 Drawing Sheets

REDUNDANCY CIRCUITS FOR SEMICONDUCTOR MEMORY

BACKGROUND

The present invention relates to redundancy circuits for semiconductor memory and particularly to using dummy cells in redundancy circuits.

Semiconductor memory devices continue to increase in density. As the density of these devices increase, it is difficult to ensure that every cell within the semiconductor memory device is free of defects. In this way, after fabrication of the semiconductor memory device, the device is typically tested in order to determine whether defective cells exist within the memory device.

When defects are detected within some memory cells of the semiconductor memory device, it is typically not practical to discard the entire device. In order to enhance the yield of semiconductor memory devices, redundancy circuits, including redundancy word lines and redundancy cells, may be used in order to compensate for defective memory cells. In this way, where a defective memory cell is found, it may be replaced by a redundancy cell.

Redundancy circuits receive address information identifying the defective cell or word line, such that a redundant cell or word line may be used in its place. In such systems, the semiconductor memory device must be provided with sufficient redundancy cells and redundancy word lines in anticipation that some of the normal cells will be found to be defective after testing.

In order to provide adequate redundant memory cells and redundant word lines, a significant number of spare memory cell elements must be provided in case cell failure is detected. In cases where the number of spare cells significantly exceeds the number of defective cells, area deficiency is degraded.

Consequently, there exists a need for the present invention.

SUMMARY

One aspect of the present invention provides a semiconductor random access memory device has an array of normal memory and an array of dummy memory cells. The array of the dummy memory cells are controlled in order to form a redundant twin-cell structure that includes at least one of the dummy memory cells.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
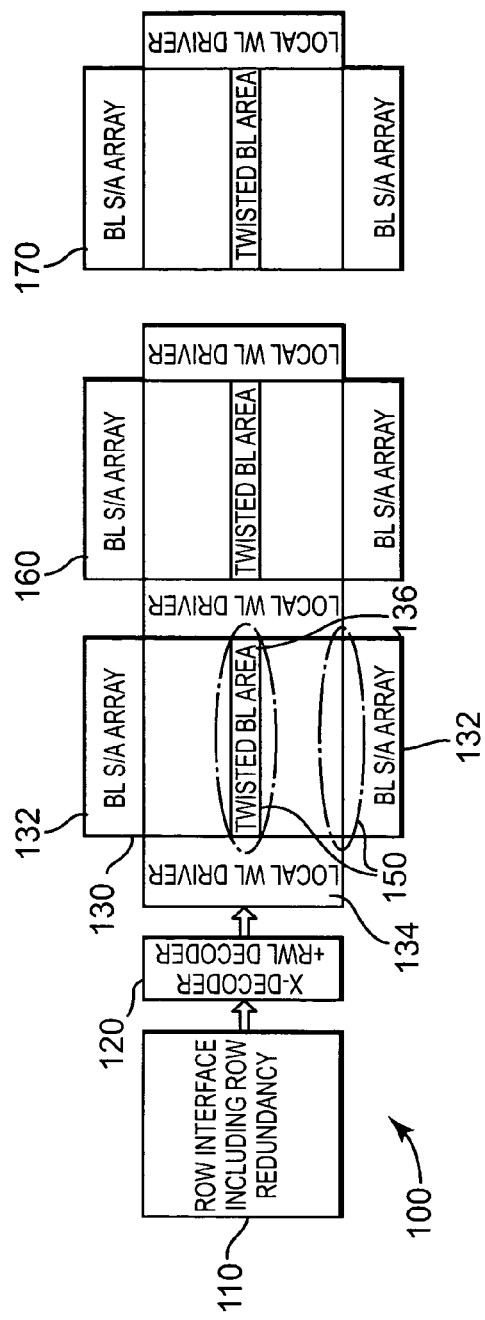
FIG. 1A illustrates a semiconductor memory array.

FIG. 1A illustrates a portion of a memory system 100. The portion of memory system 100 illustrated includes row interface 100, X-decoder circuit 120, which further includes a redundant word line decoder, first memory array 130, second memory array 160, and nth memory array 170. Memory system 100 may include a large number of memory arrays, but for simplicity of explanation, only first memory array 130 will be described in further detail. Other memory arrays, such as second memory array 160 through nth memory array 170 may be described similarly. Memory system 100, and specifically first memory array 130 and second memory array 160 through nth memory array 170, contain a large number of memory cells that may be used to store bits of data. In one embodiment, memory system 100 is a dynamic random access memory (DRAM) memory system.

First memory array 130 includes bit line sense amplifier 132, local word line driver 134, and twisted bit line area 136. Individual memory cells within first memory array 130 may be accessed via control of bit line sense amplifier 132 and local word line driver 134. Each memory cell is configured in a large memory array, each cell being located at the intersection of a multitude of word lines and bit lines, as is well-known in the art. Twisted bit line area 136 is provided to reduce some of the bit line coupling noise that may occur in the memory array.

Where testing of memory system 100 indicates that a memory cell or a word line within a memory array is defective, the row redundancy circuit within row interface 100 utilizes logic operations to disable that defective word line via redundant word line decoder within X-decoder circuit 120. In this way, the word line that tested defective is replaced with a redundant word line during operation of memory system 100. In order to operate in this way, memory system provides redundant word lines and redundant word cells as part of each of the memory arrays 130 through 170.

Typically, the memory cells arranged in memory arrays 130 through 170 are created by lithography processes. In one case, such arrays are made using optical equipment to transfer mask patterns. As a result of optical interference that occurs during pattern transfer in some instances, however, images formed on the device substrate will typically deviate from an ideal dimension and shape as represented on the mask. The amount of these deviations will depend on the characteristics of the patterns as well as a variety of other process conditions. These deviations from ideal dimensions are typically referred to as optical proximity effect. Typically, the proximity effect is demonstrated most significantly at the edges of a memory cell array. In one such case, the proximity effect is seen in edge areas 150 illustrated in FIG. 1A adjacent bit line sense amplifier 132 and adjacent twisted lit line area 136.

Figure 1B:
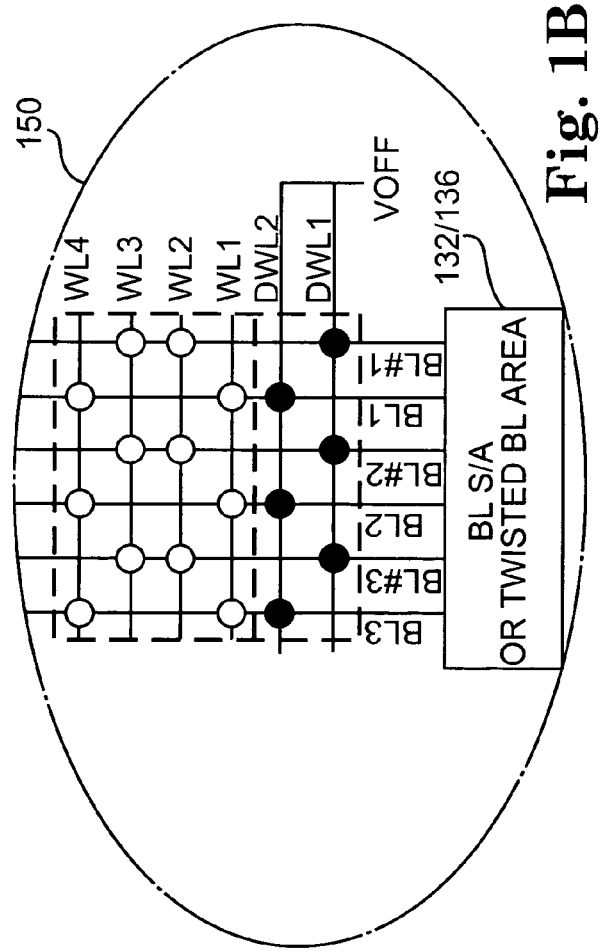
FIG. 1B illustrates a detailed diagram of a portion of the memory array illustrated in FIG. 1A.

FIG. 1B illustrates, in more detail, edge areas 150 from first memory array 130 in FIG. 1A. A portion of first memory array 130 is illustrated in edge areas 150, with a plurality of memory cells. Included in the edge areas 150 are first-fourth word lines WL1, WL2, WL3, and WL4 and first-third true/complementary bit lines BL1/BL#1, BL2/BL#2, and BL3/BL#3. Also illustrated are first and second dummy word lines DL1 and DL2. First-third true/complementary bit lines BL1/BL#1, BL2/BL#2, and BL3/BL#3 are fixed to either bit line sense amplifier 132 or to twisted bit line area 136 from first memory array 130. The intersection of certain of these bit lines and certain of these word lines define the location of individual normal memory cells illustrated in FIG. 1B as open circles. For example, one such normal memory cell is illustrated by the open circle at the intersection of the third BL3 and the fourth word line WL1. Such a cell can be referred to as a normal memory cell.

Also illustrated in FIG. 1B is a plurality of dummy cells located at the edges of the illustrated memory array. Due to the above-discussed proximity effect, memory cell arrays are typically fabricated with dummy memory cells at all edges of the memory array. In edge portions 150 illustrated in FIG. 1B, such dummy cells are illustrated with filled circles at the intersection of first and second dummy word lines DWL1 and DWL2 with first-third true/complementary bit lines BL1/BL#1, BL2/BL#2, and BL3/BL#3.

Typically, first and second dummy word line DWL1 and DWL2 are tied to an off-level voltage, $V_{OFF}$ such that these dummy memory cells do not interfere with operation of the normal memory cells. Because of the proximity effect, the dummy memory cells typically have less storage capacitance and/or may have worse transistor characteristics, than do normal memory cells. This is due to differently developed geometrical shapes of the dummy memory cells. In this way, dummy memory cells are in many cases tied off and not used.

Figure 2:
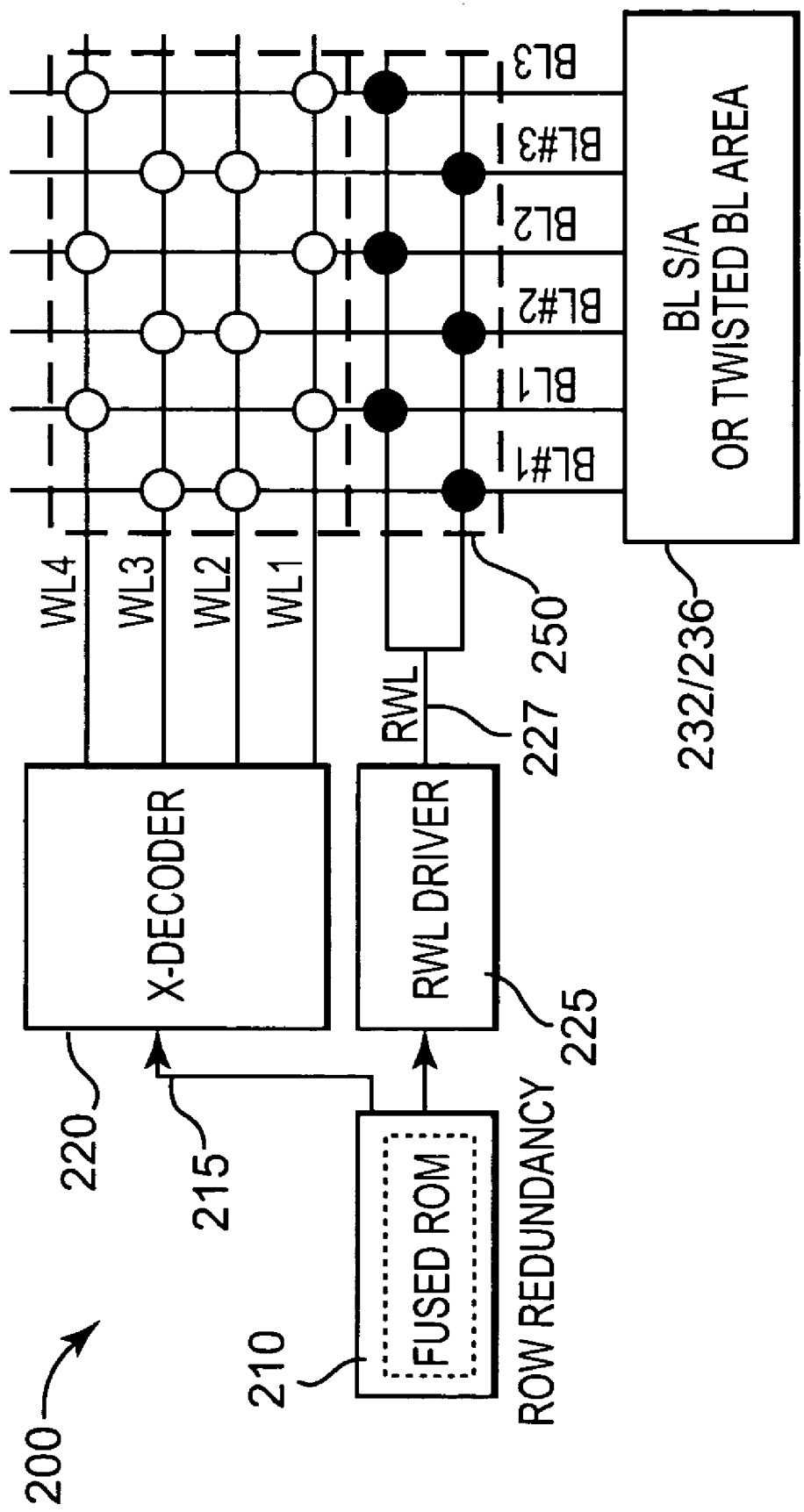
FIG. 2 illustrates a portion of a twin cell redundancy memory array in accordance with one embodiment of the present invention.

FIG. 2 illustrates a portion of memory system 200 in accordance with one embodiment of the present invention. The illustrated portion of memory system 200 includes row interface with row redundancy circuit 210, X-decoder circuit 220, redundant word line driver 225 and bit line sense amplifier 232 or twisted bit line area 236. Similar to the portion of memory array 150 illustrated in FIG. 1B, a portion of a memory array 250 is illustrated that in one embodiment is coupled to bit line sense amplifier 232, and in another embodiment is coupled to twisted bit line area 236.

The illustrated portion of memory array 250 includes a first-fourth word lines WL1–WL4, which are coupled to X-decoder circuit 220, and first-third true/complementary bit lines BL1/BL#1–BL3/BL#3, which are coupled to bit line sense amplifier/twisted bit line area 232/236. First-fourth word lines WL1–WL4 couple a plurality of normal memory cells (illustrated by open circles) to X-decoder circuit 220, and first-third true/complementary bit lines BL1/BL#1–BL3/BL#3 couple the plurality of normal memory cells to bit line sense amplifier 232/twisted bit line area 236.

The illustrated portion of memory array 250 further includes redundant word line 227, which couples a plurality of dummy memory cells (illustrated by filled circles) to redundant word line driver 225. First-third true/complementary bit lines BL1/BL#1–BL3/BL#3 also couple the plurality of dummy memory cells to bit line sense amplifier 232/twisted bit line area 236.

In this way, in one embodiment of memory system 200, dummy memory cells are utilized as redundant cells. In one case, dummy memory cells are configured in a twin-cell configuration such that two dummy memory cells are used for single-bit storage. For example, where a normal cell in a memory array is shown to be defective upon testing, two dummy memory cells can be configured in a twin-cell configuration and replace the defective normal memory cell, thereby providing a redundant memory cell. In this way, dummy memory cells, which are typically already provided at the edges of memory cell arrays due to the proximity effect, are now utilized as redundant memory cells, thereby increasing the overall efficiency of the memory cell array.

In one embodiment, row redundancy circuit 210 includes a fused ROM that is programmable. In one case, programming row redundancy circuit 210 is accomplished by a laser. In another embodiment, redundancy circuit is programmed using an electronic fuse. In either case, row redundancy circuit 210 is programmed such that redundancy word line 227 will be accessed in place of a defective row when such defective row is identified. In one embodiment, redundant word line driver 225 directly controls and drives redundant word line 227 to access each of the twin-cell configured dummy memory cells. Alternatively, write word line 227 could be configured similar to normal word lines such that X-decoder 220 would have a hierarchical word line driver structure. In either case, redundant word line timing of the dummy memory cells is compatible to any timing of normal write lines.

Where testing has indicated that a normal memory cell or a normal word line is defective, row redundancy circuit 210 utilizes logic operation to disable that defective normal row via normal row disable signal 215, which is sent to X-decoder circuit 220. Then, in place of the defective normal row, row redundancy circuit 210 enables redundant word line driver 225 to access redundant word line 227. Since redundant word line 227 is coupled to two dummy word lines, twin-cell operation for replacing the defective row is realized. Twin-cell configuration means that two dummy memory cells are used to replace a single normal memory cell for single-bit storage. The two dummy memory cells utilized in one case are complementary. For example, in one case twin-cell configured dummy cells are first true bit line BL1 and complementary bit line BL#1. In another case, twin-cell configured dummy cells are not complementary, such as first true bit line BL1 and second true bit line BL2.

Although dummy memory cells typically can not be used for single-cell storage since they typically have smaller storage capacitance and/or worse transistor characteristics then normal memory cells, combining two dummy cells into a twin-cell configuration allows their utilization as redundant memory cells, thereby increasing the overall efficiency of the memory cell array.

In one embodiment, row redundancy circuit 210 includes a fused ROM that is programmable. In one case, programming row redundancy circuit 210 is accomplished by a laser. In another embodiment, redundancy circuit is programmed using an electronic fuse. In either case, row redundancy circuit 210 is programmed such that redundancy word line 227 will be accessed in place of a defective row when such defective row is identified. In one embodiment, redundant word line driver 225 directly controls and drives redundant word line 227 to access each of the twin-cell configured dummy memory cells. Alternatively, write word line 227 could be configured similar to normal word lines such that X-decoder 220 would have a hierarchical word line driver structure. In either case, redundant word line timing of the dummy memory cellos is compatible to any timing of normal write lines.

Figure 3:
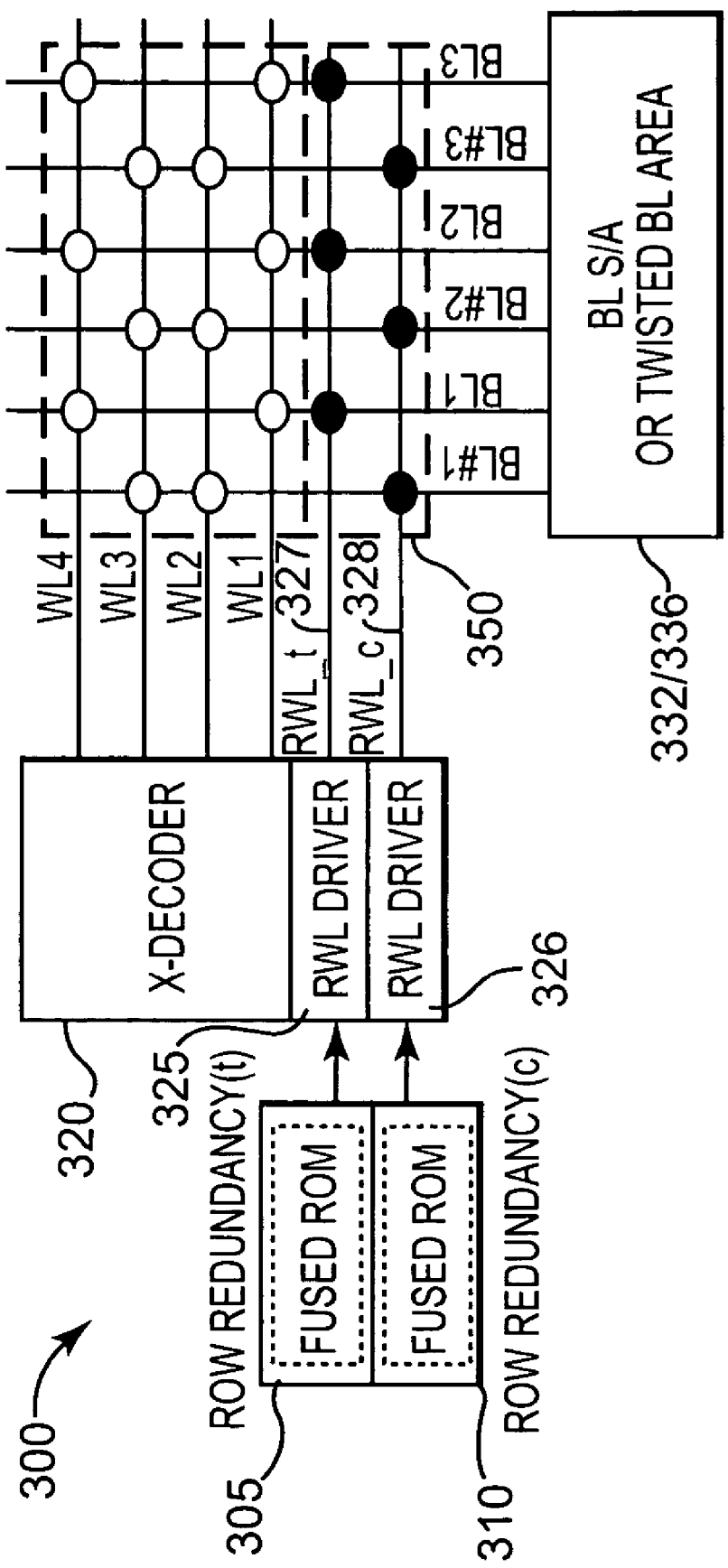
FIG. 3 illustrates an alternative twin cell redundancy memory array in accordance with another embodiment of the present invention.

FIG. 3 illustrates a portion of memory system 300 in accordance with an alternative embodiment of the present invention. In one case, the illustrated portion of memory system 300 includes a row interface including first row redundancy circuit 305 and second row redundancy circuit 310, X-decoder circuit 320, and bit line sense amplifier 332 or twisted bit line area 336. X-decoder circuit 320 further includes true redundant word line driver 325 and complementary redundant word line driver 326. Similar to above, a portion of a memory array 350 is illustrated that in one embodiment is coupled to bit line sense amplifier 332, and in another embodiment is coupled to twisted bit line area 336.

The illustrated portion of memory array 350 includes a first-fourth word lines WL1–WL4, which are coupled to X-decoder circuit 320, and first-third true/complementary bit lines BL1/BL#1–BL3/BL#3, which are coupled to bit line sense amplifier/twisted bit line area 332/336. First-fourth word lines WL1–WL4 couple a plurality of normal memory cells (illustrated by open circles) to X-decoder circuit 320, and first-third true/complementary bit lines BL1/BL#1–BL3/BL#3 couple the plurality of normal memory cells to bit line sense amplifier 332/twisted bit line area 336.

The illustrated portion of memory array 350 further includes true redundant word line 327 and complementary redundant word line 328, which each couple a plurality of dummy memory cells (illustrated by filled circles) to true/complementary redundant word line drivers 325 and 326, respectively. First-third true/complementary bit lines BL1/BL#1–BL3/BL#3 also couple the plurality of dummy memory cells to bit line sense amplifier 332/twisted bit line area 336.

In this way, in one embodiment of memory system 300, dummy memory cells are utilized as redundant cells. In one case, dummy memory cells are configured in a twin-cell configuration such that one dummy memory cells is coupled with one normal cell, and the pair is then used for single-bit storage. For example, where a normal cell or normal world line in a memory array is shown to be defective upon testing, redundancy cells are formed by connecting one dummy word line with the failed normal word line in order to create a twin-cell structure. Using this technique, even where a defect has caused weak normal cells, such cells may still be usable when combined in a twin-cell configuration with a dummy memory cell.

In one embodiment, row redundancy circuits 305 and 310 facilitate utilization of dummy memory cells. In one case, row redundancy word line drivers 325 or 326 communicate with X-decoder 320 in order to access the plurality of dummy cells in combination with normal memory cells. In one embodiment, true redundant word line driver circuit 325 enables dummy memory cells via true redundant word line 327. In this way, dummy memory cells may be coupled with normal memory cells to form twin-cell configurations. In another embodiment, complementary redundant word line driver circuit 326 enables dummy memory cells via true redundant word line 328.

Where testing has indicated that a normal memory cell or a normal word line is defective, row redundancy circuits 305 and 310 utilize logic operation to enable a dummy word line so that the defective normal word line and dummy word line are combined to form twin-cell configurations. In one case, a normal word line is combined with complementary dummy lines such that a complementary twin-cell structure is formed. For example, if fourth word line WL4 indicates a weak signal necessitating its combination with a dummy word cell, complementary row redundancy circuit 310 enables complementary redundant word line driver 326 to access complementary redundant word line 328. In this way, dummy memory cells on complementary redundant word line 328 are coupled with those memory cells on the fourth word line WL4, such that twin-cell operation is realized. Twin-cell configuration in this case means that a dummy memory cells and normal memory cell that tested defective are used to replace a single normal memory cell for single-bit storage.

Similarly, a normal word line that tests defective may also be combined with the non-complementary dummy lines to form twin-cell structures. In this way, true row redundancy circuit 305 enables true redundant word line driver 325 to access true redundant word line 327, thereby combing those dummy memory cells on true redundant word line 327 with those memory cells on the fourth word line WL4, such that twin-cell operation is realized.

In one embodiment, redundancy write line drivers 325 and 326 directly drive redundancy write lines 327 and 328 of the dummy word cells. In another embodiment, redundancy write line drivers 325 and 326 operate similarly to normal rows and X-decoders such that they have hierarchical write line driver structure. In any case, redundancy write line timing is compatible to the timing of normal write lines.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory system comprising:
   an array of normal memory cells;
   an array of dummy memory cells having less capacitance than the normal memory cells; and
   means for controlling the array of the dummy memory cells in order to form a redundant twin-cell structure comprising at least one of the dummy memory cells.

2. The memory system of claim 1, wherein the array of normal memory cells are tested to detect a defective normal memory cell, and wherein the redundant twin-cell structure is used in place of the defective normal memory cell.

3. The memory system of claim 2 further comprising a plurality of world lines providing access to a plurality of the array of normal memory cells, at least one redundancy word line providing access to a plurality of the array of dummy memory cells, and a decoder circuit coupled to the world lines and redundancy word line.

4. The memory system of claim 3, wherein the redundant twin-cell structure comprises one dummy word cell and one normal memory cell combined as twin-cell used for single-bit storage.

5. The memory system of claim 3, wherein the redundant twin-cell structure comprises two dummy word cells combined as twin-cell used for single-bit storage.

6. A memory system comprising:
   a row interface circuit;
   a decoder circuit coupled to the row interface circuit; and
   a plurality of memory arrays, each of the plurality of memory arrays coupled to the decoder circuit and each further comprising:
      a plurality of world lines coupling a plurality of normal memory cells;
      at least one redundancy word line coupling a plurality of dummy memory cells, having less storage capacitance than normal cells; and
a plurality of bit lines coupling the plurality of normal memory cells and dummy memory cells;
wherein the row interface circuit controls the decoder circuit such that the decoder circuit accesses the at least one redundancy word line to form a redundant twin-cell structure.

7. The memory system of claim 6, wherein the plurality of normal memory cells are tested to detect a defective normal memory cell, and wherein the redundant twin-cell structure is used in place of the defective normal memory cell.

8. The memory system of claim 7, wherein the redundant twin-cell structure comprises one dummy memory cell and one normal memory cell combined as twin-cell used for single-bit storage.

9. The memory system of claim 7, wherein the redundant twin-cell structure comprises two dummy memory cells combined as twin-cell used for single-bit storage.

10. A memory system comprising:
a decoder circuit coupled to a row interface circuit; and
a memory array coupled to the decoder circuit, the memory array further comprising:
a plurality of world lines coupling a plurality of normal memory cells; and
a redundancy word line coupling a plurality of dummy memory cells having less
storage capacitance than normal memory cells;
wherein the decoder circuit accesses the redundancy word line to form a redundant twin-cell structure using two dummy memory cells.

11. The memory system of claim 10, wherein the redundancy word line comprises two dummy word lines tied together to provide access to the plurality of dummy memory cells.

12. The memory system of claim 10 further comprising a plurality of bit lines coupling the plurality of normal memory cells and dummy memory cells in order to selectively access the contents of the normal and dummy memory cells.

13. A memory system comprising:
a decoder circuit coupled to a row interface circuit; and
a memory array coupled to the decoder circuit, the memory array further comprising:
a plurality of world lines coupling a plurality of normal memory cells; and
at least one redundancy word line coupling a plurality of dummy memory cells,
which have less storage capacitance than normal memory cells;
wherein the decoder circuit accesses the redundancy word line to form at least one redundant twin-cell structure using one dummy memory cell and one normal memory cell.

14. The memory system of claim 13, wherein the redundancy word line comprises two dummy word lines tied together to provide access to the plurality of dummy memory cells.

15. The memory system of claim 13 further comprising a plurality of bit lines coupling the plurality of normal memory cells and dummy memory cells in order to selectively access the contents of the normal and dummy memory cells, and wherein the dummy memory cells are formed at the edges of the memory array and are influenced by a proximity effect to cause there shape to dictate less storage capacitance that normal memory cells.

16. A method of storing information in a semiconductor memory device having a memory array with normal memory cells and with dummy memory cells, the method comprising:
running a test on the normal memory cells within the memory array in order to detect a defective normal memory cell;
identifying a word line associated with the defective normal memory cell;
disabling the word line associated with the defective normal memory cell; and
enabling dummy memory cells configured as twin-cells in place of the defective normal cell, wherein the dummy memory cells are formed in such a way that they have less storage capacitance than do normal memory cells.

17. The method of claim 16, further comprising using the dummy memory cells configured as twin-cells for single-bit storage.

18. A method of storing information in a semiconductor memory device having a memory array with normal memory cells and with dummy memory cells, the method comprising:
running a test on the normal memory cells within the memory array in order to detect a defective normal memory cell;
identifying a word line associated with the defective normal memory cell; and
coupling the word line associated with the defective normal memory cells with a redundancy word line associated with dummy memory cells having less storage capacitance than normal memory cells such that twin-cells are configured comprising at least one normal memory cell and one dummy memory cell.

19. The method of claim 18, further comprising using at least one normal memory cell and one dummy memory cell configured as twin-cells for single-bit storage.

20. A memory cell array comprising:
a plurality of word lines and a plurality of bit lines;
at least one redundancy word line;
at least some of the plurality of word lines and at least some of the plurality of bit lines intersecting at a plurality of normal memory cells, thereby providing access to the plurality of normal memory cells via at least some of the plurality of word lines and at least some of the plurality of bit lines; and
the at least one redundancy word line and at least some of the plurality of bit lines intersecting at a plurality of dummy memory cells having less storage capacitance than normal memory cells, thereby providing access to the plurality of dummy memory cells via the at least one redundancy word line and at least some of the plurality of bit lines;
wherein at least one dummy memory cell is combined with another memory cell to form a twin-cell structure for single-bit storage.

21. The memory cell array of claim 20, wherein the twin-cell structure for single-bit storage comprises one dummy memory cell and one normal memory cell combined together.

22. The memory cell array of claim 20, wherein the twin-cell structure for single-bit storage comprises two dummy memory cells combined together.

* * * * *

UNITED STATES PATENT AND TRADEMARK OFFICE
CERTIFICATE OF CORRECTION

| | |
|---|---|
| PATENT NO. | : 7,224,626 B2 |
| APPLICATION NO. | : 11/108179 |
| DATED | : May 29, 2007 |
| INVENTOR(S) | : Oh |

It is certified that error appears in the above-identified patent and that said Letters Patent is hereby corrected as shown below:

Column 3, line 12, delete "WL1" and insert in place thereof --WL4--.

Column 4, line 7, delete paragraph and insert in place thereof --In one embodiment, row redundancy circuit 210 facilitates utilization of the dummy memory cells. In one case, row redundancy circuit 210 communicates with X-decoder circuit 220 and redundant word line driver 225. In one embodiment, redundant word line driver circuit 225 enables dummy memory cells via redundant word lines 227. In this way, dummy memory cells may be configured as twin-cells accessed via redundant word line 227.--.

Column 4, line 61, delete "cellos" and insert in place thereof --cells--.

Column 7, line 66, delete "that" and insert in place thereof --than--.

Signed and Sealed this

Eighth Day of June, 2010

David J. Kappos
*Director of the United States Patent and Trademark Office*